United States Patent [19]

Kondo et al.

[11] Patent Number: 5,118,583

[45] Date of Patent: Jun. 2, 1992

[54] PROCESSING COMPOSITION FOR PRINTING PLATE

[75] Inventors: Toshiro Kondo; Hidetoshi Miura; Kyonosuki Yamamoto; Sukeaki Date, all of Nagaokakyo, Japan

[73] Assignee: Mitsubishi Paper Mills Limited, Tokyo, Japan

[21] Appl. No.: 417,040

[22] Filed: Oct. 4, 1989

[30] Foreign Application Priority Data

| Oct. 12, 1988 | [JP] | Japan | 63-257635 |
| Oct. 12, 1988 | [JP] | Japan | 63-257637 |
| Feb. 7, 1989 | [JP] | Japan | 1-029338 |
| Feb. 7, 1989 | [JP] | Japan | 1-029339 |
| Mar. 24, 1989 | [JP] | Japan | 1-073466 |
| Mar. 29, 1989 | [JP] | Japan | 1-077852 |
| Apr. 25, 1989 | [JP] | Japan | 1-106726 |

[51] Int. Cl.$^5$ .................................................. G03F 7/00
[52] U.S. Cl. ....................... 430/309; 430/204; 430/267; 430/268; 430/302; 430/331; 101/451; 101/452; 101/466
[58] Field of Search ............... 430/268, 204, 331, 309, 430/302, 264, 265, 267; 101/451, 452, 466

[56] References Cited

U.S. PATENT DOCUMENTS

| 4,230,792 | 10/1980 | Tsubai et al. | 430/302 |
| 4,401,739 | 8/1983 | Senga et al. | 430/16 |
| 4,443,531 | 4/1984 | Yamada et al. | 430/204 |
| 4,454,216 | 6/1984 | Horii et al. | 430/204 |
| 4,563,410 | 1/1986 | DeJaeger et al. | 430/204 |

FOREIGN PATENT DOCUMENTS

| 58-127928 | 7/1983 | Japan . |
| 942823 | 11/1963 | United Kingdom . |

*Primary Examiner*—Marion E. McCamish
*Assistant Examiner*—Janis L. Dote
*Attorney, Agent, or Firm*—Cushman, Darby & Cushman

[57] ABSTRACT

The present invention provides a processing composition which is used for lithographic printing plate where silver image is used as ink receptive area for enhancing ink receptivity of the silver image. This composition contains an organic compound having two or more mercapto groups or thion groups and, in combination therewith, an aromatic sulfonic acid formalin condensate, an anionic surfactant having a polyoxyethylene group, an aromatic carboxylic acid, a hydrosulfite compound, a water-soluble polymer having a carboxyl group and having a number-average molecular weight of about 20,000 or less, a hydroxyaryl fatty acid, or an organic disulfide compound. If this composition additionally contains an oxidizing agent, it can further improve printing endurance of the printing plate.

7 Claims, No Drawings

PROCESSING COMPOSITION FOR PRINTING PLATE

BACKGROUND OF THE INVENTION

The present invention relates to a process for making a lithographic printing plate having a silver image utilized as ink receptive areas and in particular to a processing composition for enhancing ink receptivity of silver image.

There have already been practically used printing plates which are made using silver halide emulsions having high sensitivity and capable of being spectrally sensitized. Among them, offset printing plates where silver images are utilized as ink receptive areas are disclosed in U.S. Pat. Nos. 3,721,559, 3,490,905, 3,385,701, 3,814,603, 3,454,398, 3,764,323 and 3,099,209, Japanese Patent Kokoku No. 48-30562 and 44-27242 and Japanese Patent Kokai Nos. 53-21602 and 53-9603.

These may be roughly classified to some types of printing plates, but they are common in utilization of silver as ink-receptive areas.

A lithographic printing plate consists of greasy ink receptive oleophilic image portions and ink repellent hydrophilic non-image portions, the latter being generally water receptive hydrophilic areas.

Accordingly, the ordinary lithographic printing is carried out by feeding both water and colored ink to the printing plate surface to allow the image portions to receive preferentially the colored ink and the non-image portions to receive preferentially water and then transferring the ink on the image portions onto a substrate such as paper.

In order to obtain a print of good quality, it is necessary that oleophilicity of the image portions and hydrophilicity of the non-image portions are both strong enough so that when water and ink are applied the image portions may receive sufficient amount of ink while the non-image portions may completely repel the ink and it is desired that this effect can be retained for printing of as many as possible copies.

The process for making printing plate using silver halide emulsion mentioned above is simple and reliable and can be performed at high speed and can be automated and besides the resulting printing plate has a high sensitivity, a high resolution and a high image reproducibility. However, the process suffers from the problem that the resulting printing plates cannot stand printing of a larger number of copies, namely, inferior in printing endurance as compared with other printing plates, for example, PS plates put in practical use which consists essentially of a bichromate sensitized hydrophilic colloid and a diazo sensitized organic colloid.

Many attempts have been made for improving these defects.

Japanese Patent Kokoku No. 48-29723 has proposed to improve ink receptivity and printing endurance by treating transfer silver image with an organic compound having a mercapto group or a thione group. Furthermore, Japanese Patent Kokai No. 58-127928 discloses that 2,4-dimercapto-6-substituted 1,3,5-triazine compound is superior to organic compound having one mercapto group in improvement of printing endurance.

The inventors' have already proposed a process which can attain conspicuously remarkable improvement of printing endurance by using an organic compound having 2 or more mercapto groups. However, processing solution containing an organic compound having 2 or more mercapto groups or thione groups suffers from the significant problems that it is considerably inferior in storage stability and oleophilizing ability of the compound deteriorates with lapse of time. Therefore, oleophilizing solution has been demanded which is improved in storage stability without giving adverse effect to printability.

SUMMARY OF THE INVENTION

The object of the present invention is to provide an oleophilizing composition for lithographic printing plates where silver image is utilized as ink receptive areas which is improved in storage stability without damaging printability.

The above object has been attained by a processing composition which is used for lithographic printing plate where silver image is used as ink receptive area and which contains an organic compound having 2 or more mercapto groups or thione groups, characterized in that the composition additionally contains an aromatic sulfonic acid formalin condensate, an anionic surface active agent having a polyoxyethylene group, an aromatic carboxylic acid, a hydrosulfite compound, a water-soluble polymer having a carboxyl group and having a number-average molecular weight of about 20,000 or less, a hydroxyaryl fatty acid, or an organic disulfide compound.

DESCRIPTION OF THE INVENTION

Typical examples of the organic compound having 2 or more mercapto groups or thione groups used in the present invention are shown below.

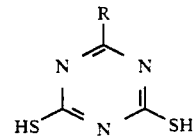

| Compounds | R in the above formula |
| --- | --- |
| I-1 | H |
| I-2 | $NH_2$ |
| I-3 | OH |
| I-4 | SH |
| I-5 | $CH_3$ |
| I-6 | $C_4H_9$ |
| I-7 | $C_6H_5$ |
| I-8 | $OC_2H_5$ |
| I-9 | $OC_4H_9$ |
| I-10 | $OC_6H_{13}$ |
| I-11 | $OC_6H_5$ |
| I-12 | $OCH_2C_6H_5$ |
| I-13 | $NHC_4H_9$ |
| I-14 | $NHC_8H_{17}$ |
| I-15 | $NHC_{12}H_{25}$ |
| I-16 | $NHC_6H_{11}$ |
| I-17 | $N(C_2H_5)_2$ |
| I-18 | $N(C_4H_9)_2$ |
| I-19 | $NHCH_2C_6H_5$ |
| I-20 | $NHC_6H_5$ |
| I-21 | $N(CH_2CH=CH_2)_2$ |
| I-22 |  |
| I-23 | 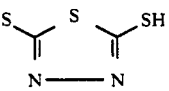 |

-continued

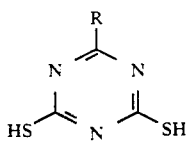

Compounds R in the above formula

I-24 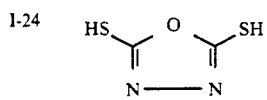

I-25 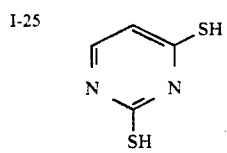

I-26 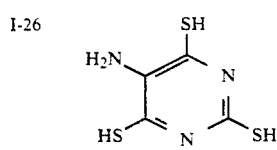

I-27 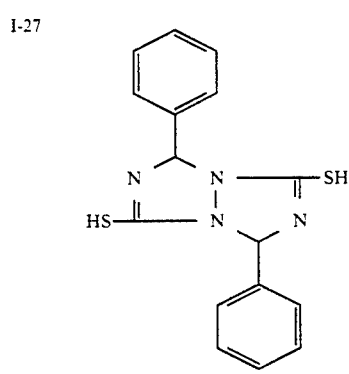

I-28 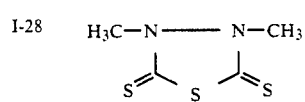

I-29 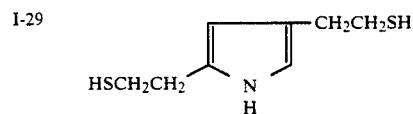

I-30 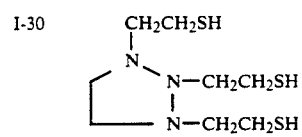

I-31 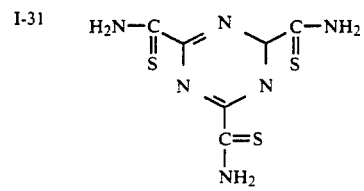

-continued

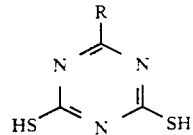

Compounds R in the above formula

I-32 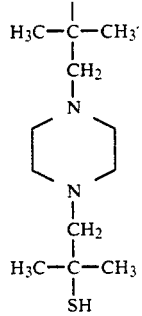

I-33 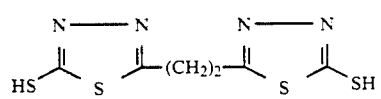

I-34 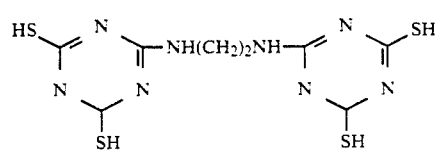

I-35 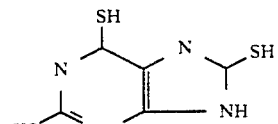

One or more of these compounds are contained in various processing solutions used in photographic plate making such as developing solution, stopping solution, and fixing solution or various processing solutions used in printing step such as etch solution and dampening solution. Alternatively, a special processing solution may be prepared for application of these compounds.

Concentration of these compounds is suitably about 0.01% to about 5% by weight.

Explanation will be made on the compounds which are used in combination with the organic compound having 2 or more mercapto groups or thione groups in the present invention.

(1) Aromatic sulfonic acid formalin condensates

These are marketed as anionic surfactants from various manufacturers and are easily available.

Typical examples are sodium β-naphthalenesulfonate formalin condensate and sodium methylnaphthalenesulfonate formalin condensate represented by the following formula:

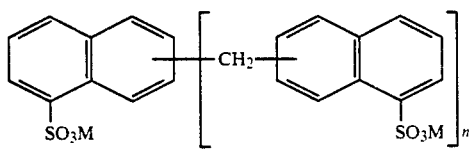

(wherein n is an integer of 1 or more, preferably 2-5 and M denotes an alkali metal atom).

A sulfonated product of creosote oil formalin condensate may also be used.

Content of these surfactants is suitably about 0.1% to about 20% by weight and these surfactants are preferably used at a weight ratio of about 1 to about 100 times the weight of said organic compounds.

(2) Anionic surfactants having a polyoxyethylene group

These surfactants are preferably represented by the following formula:

(wherein R denotes a substituted or unsubstituted alkyl, alkenyl or aryl group of 1-30 carbon atoms, Q denotes

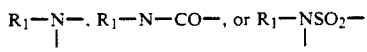

(wherein $R_1$ denotes a hydrogen atom or a substituted or unsubstituted alkyl group), B denotes a divalent group such as an alkylene group, an arylene group, an oxypropylene group or the like, m is O or an integer of 1 or more, A denotes an anion such as —SO$_3$M, —COOM, —O—SO$_3$M,

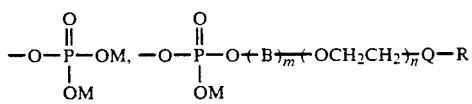

(wherein M denotes a cation such as a hydrogen atom, an alkali metal, an alkaline earth metal, ammonium, a lower alkylamine or the like, and B, Q and R are as defined above), and n denotes an average polymerization degree of ethylene oxide of 1-50, preferably 2-10).

These compounds are mentioned in U.S. Pat. Nos. 3,026,202, 2,600,831, 2,719,087, 3,201,252, 3,415,649, 3,264,108, and 2,600,831, Japanese Patent Kokai No. 54-98235, Japanese Patent Kokoku No. 40-23747, and British Nos. 1,178,546 and 1,344, 987.

Examples of the anionic surfactants having polyoxyethylene are shown below (wherein CH$_2$CH$_2$O is abbreviated to "EO").

$C_8H_{17}O(EO)_2(CH_2)_4SO_3Na$ (II-1)

$C_{12}H_{25}O(EO)_4(CH_2)_4SO_3Na$ (II-2)

$C_{18}H_{35}O(EO)_8(CH_2)_3SO_3Na$ (II-3)

$C_{12}H_{25}S(EO)_3(CH_2)_4SO_3Na$ (II-4)

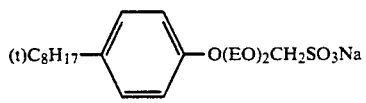 (II-5)

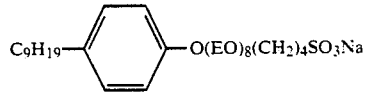 (II-6)

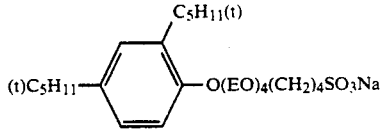 (II-7)

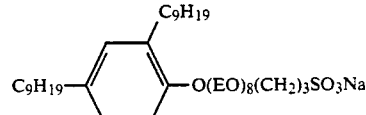 (II-8)

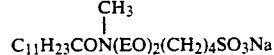 (II-9)

$C_9H_{19}O(EO)_4SO_3K$ (II-10)

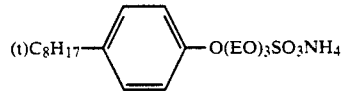 (II-11)

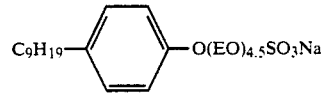 (II-12)

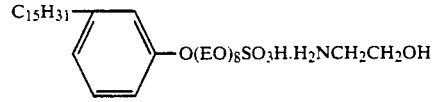 (II-13)

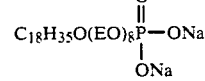 (II-14)

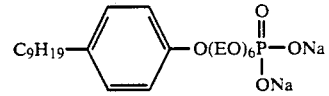 (II-15)

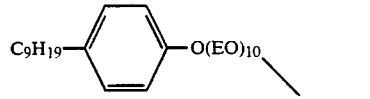 (II-16, II-17)

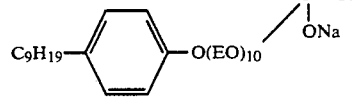 (II-18)

(3) Aromatic carboxylic acid

This aromatic carboxylic acid is represented by the formula:

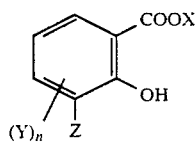

5

(wherein X denotes a hydrogen atom, an alkali metal atom such as sodium, potassium or lithium ion, ammonium ion, an alkyl group of 1-10 carbon atoms, preferably 1-5 carbon atoms, or an aryl group such as phenyl group or naphthyl group, these alkyl group and aryl group may be substituted and examples of the substituent are halogen atoms (such as chlorine atom and bromine atom), hydroxyl group, alkoxy group of 1-4 carbon atoms, sulfonic acid group, carboxylic acid group, aldehyde group, nitro group and amino group; Y denotes a substituent of phenyl group and examples thereof are halogen atom, alkyl group, alkoxy group, amino group, hydroxy group, nitro group, sulfonic acid group, and carboxylic acid group, and when n is 2 or 3, Y may be identical or different, the halogen atom includes fluorine atom, chlorine atom, bromine atom and iodine atom, the alkyl group and alkoxy group have 1-10, preferably 1-5 carbon atoms, the alkyl group and alkoxy group may be substituted, for example, with halogen atom, hydroxy group, sulfonic acid group, or carboxylic acid group, the amino group may be substituted with lower alkyl group, the sulfonic acid and carboxylic acid may form a salt with lithium, sodium, potassium, or ammonium ion, and Y is preferably methyl group, ethyl group, methoxy group, ethoxy group, halogen atom (chlorine atom, bromine atom), sulfonic acid group or carboxylic acid group, and especially preferred are sulfonic acid group and carboxylic acid group; Z is a hydrogen atom or a substituent of phenyl group and denotes a halogen atom, an alkyl group, an alkoxy group, an amino group, a nitro group, a sulfonic acid group, or a carboxylic acid group, examples of the halogen atom are fluorine atom, chlorine atom, bromine atom and iodine atom and the alkyl group and alkoxy group have 1-10, preferably 1-5 carbon atoms, the alkyl group and alkoxy group may be substituted with halogen atom, hydroxy group, sulfonic acid group, carboxylic acid group, or the like, the amino group may be substituted with a lower alkyl group, the sulfonic acid group and carboxylic acid group may form a salt with lithium, sodium, potassium or ammonium ion, and Z is preferably hydrogen atom, methyl group, ethyl group, methoxy group, ethoxy group, halogen atom (chlorine atom, bromine atom), sulfonic acid group or carboxylic acid group and especially preferred are hydrogen atom, sulfonic acid group and carboxylic acid group; and n is 0, 1, 2 or 3 and is preferably 0, 1 or 2).

Examples of the aromatic carboxylic acid are shown below.

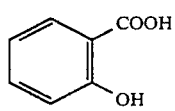

III-1

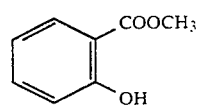

III-2

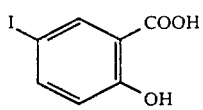

III-3

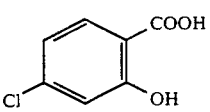

III-4

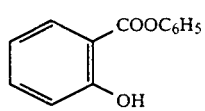

III-5

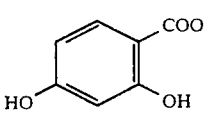

III-6

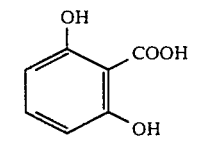

III-7

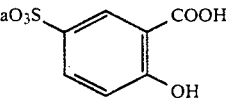

III-8

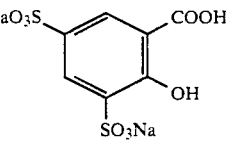

III-9

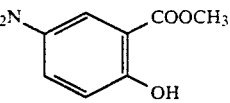

III-10

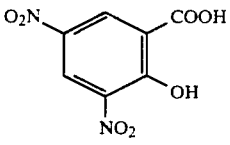

III-11

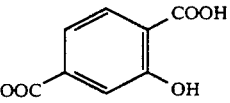

III-12

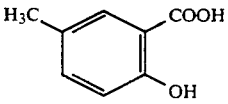

III-13

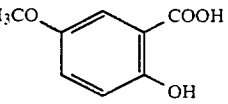

III-14

-continued

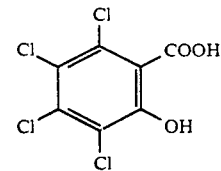 III-15

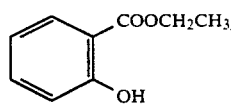 III-16

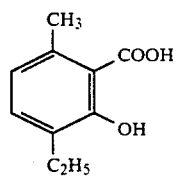 III-17

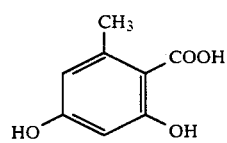 III-18

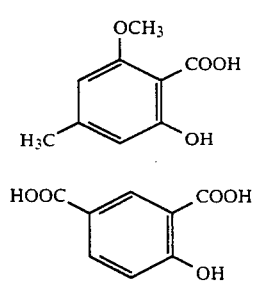 III-19

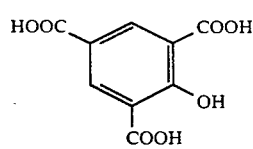 III-20

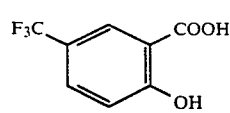 III-21

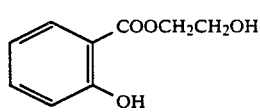 III-22

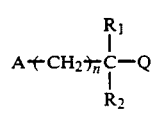 III-23

(4) Hydrosulfite adduct

This is represented by the formula:

$$A(CH_2)_n \underset{R_2}{\overset{R_1}{C}} Q$$

(wherein A denotes a hydroxyl group, an amino group or

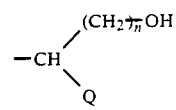

$R_1$ and $R_2$ form a ring together with C atom to which $R_1$ and $R_2$ bond, or one of them denotes a hydrogen atom and another denotes a hydrogen atom, an alkyl group, an aryl group or a hydroxyl group, n denotes 0 or an integer of 1-8, Q denotes —SO$_3$M or —SO$_2$M, and M denotes a cation such as a hydrogen atom, an alkali metal atom, or the like).

Examples of the hydrosulfite adduct represented by the formula are shown below.

HO—CH$_2$—SO$_3$Na  (IV-1)

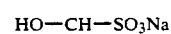 (IV-2)

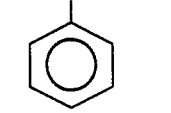 (IV-3)

HO—(CH$_2$)$_2$—SO$_3$K  (IV-4)

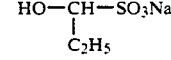 (IV-5)

HO—(CH$_2$)$_6$—SO$_3$NH$_4$  (IV-6)

 (IV-7)

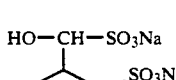 (IV-8)

 (IV-9)

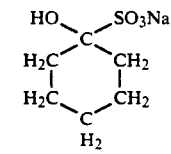 (IV-10)

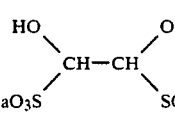 (IV-11)

-continued

H₂N—CH₂—SO₃Na (IV-12)

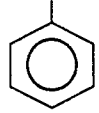
H₂N—CH—SO₃Na (IV-13)

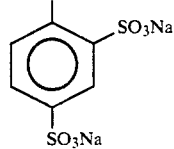
H₂N—CH—SO₃Na (IV-14)

HO—CH₂—SO₂Na (IV-15)

HO—(CH₂)₂—SO₂Na (IV-16)

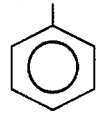
HO—CH—SO₂K (IV-17)

H₂N—CH₂—SO₂Na (IV-18)

(5) Water-soluble polymer having a carboxyl group and having a number-average molecular weight of about 20,000 or less (the carboxyl group includes its salt and acid anhydride):

The water-soluble polymer can be homopolymer of olefinic unsaturated compounds containing carboxyl group as a monomer unit such as acrylic acid, methacrylic acid, sorbic acid, maleic acid, fumaric acid, itaconic acid and citraconic acid or copolymer of olefinic unsaturated compound having carboxyl group as a monomer unit and vinyl monomer copolymerizable therewith.

As the vinyl monomer for obtaining the copolymer used in the present invention, mention may be made of, for example, styrene and styrene derivatives such as styrenes substituted with alkyl such as methyl, ethyl or the like, styrenes substituted with alkoxy such as methoxy, ethoxy, or the like, and styrenes substituted with halogen such as chlorine or the like, ethylenically unsaturated monoolefins such as ethylene, propylene, butylene, and isobutylene, halogenated vinyls such as vinyl chloride, vinylidene chloride, and vinyl bromide, vinyl esters such as vinyl acetate, vinyl propionate, vinyl benzoate, and vinyl butyrate, alkyl esters of acrylic acid or methacrylic acid such as methyl, ethyl, propyl, isobutyl, n-butyl, n-octyl, or 2-ethylhexyl acrylates or methacrylates, acrylic acid or methacrylic acid derivatives such as acrylonitrile, methacrylonitrile and acrylamide, vinyl ethers such as vinylmethyl ether, vinylethyl ether, and vinylisobutyl ether, vinyl ketones such as vinyl methyl ketone, vinyl hexyl ketone and methyl isopropyl ketone, N-vinyl compounds such as N-vinylpyrrole, N-vinylcarbazole and N-vinylpyrrolidone, and vinylnaphthalenes. Oleophinically unsaturated compounds of different kind containing carboxyl group may be a copolymer component. Preferred are copolymers containing oleophilic vinyl monomer such as styrene as a copolymer component.

Content of the olefinically unsaturated compound containing carboxyl group in copolymer is about 0% by weight or more, preferably about 20% by weight or more. This carboxyl group may be in the form of a salt of sodium, potassium, ammonium, or the like or an acid anhydride (such as maleic anhydride).

The water-soluble polymers used in the present invention have a number-average molecular weight ($\overline{M}n$) of about 20,000 or less, preferably about 1,000—about 5,000.

The water-soluble polymers can be easily prepared by known methods such as solution polymerization and these may be easily commercially available.

Examples thereof are shown below. The polymerization degree is shown by % by weight.

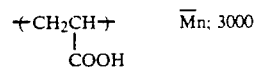 (V-1)

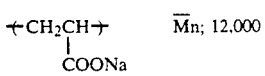 (V-2)

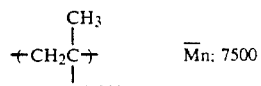 (V-3)

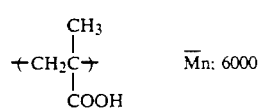 (V-4)

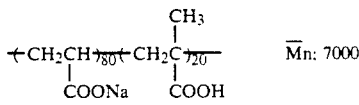 (V-5)

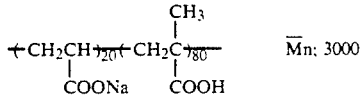 (V-6)

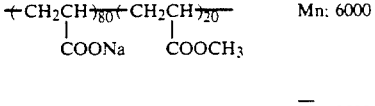 (V-7)

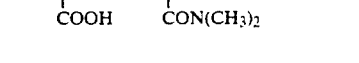 (V-8)

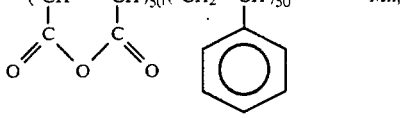 (V-9)

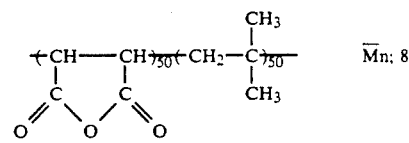 (V-10)

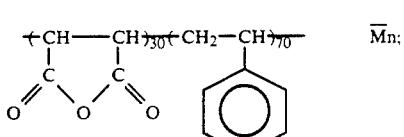 (V-11)

-continued

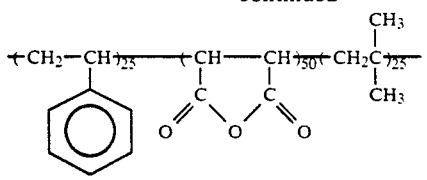 (V-12) $\overline{Mn};$ 4500

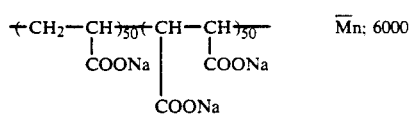 (V-13) $\overline{Mn};$ 6000

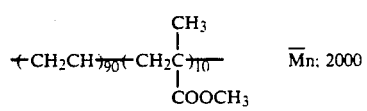 (V-14) $\overline{Mn};$ 2000

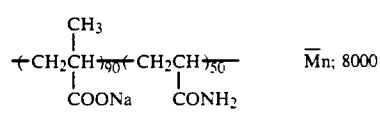 (V-15) $\overline{Mn};$ 8000

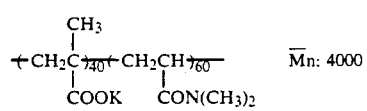 (V-16) $\overline{Mn};$ 4000

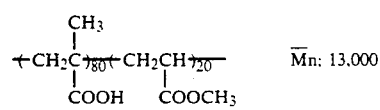 (V-17) $\overline{Mn};$ 13,000

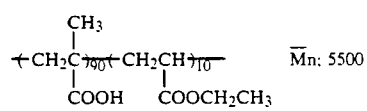 (V-18) $\overline{Mn};$ 5500

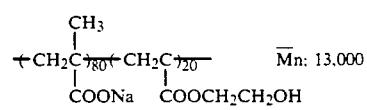 (V-19) $\overline{Mn};$ 13,000

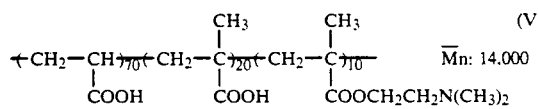 (V-20) $\overline{Mn};$ 14,000

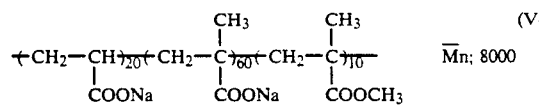 (V-21) $\overline{Mn};$ 8000

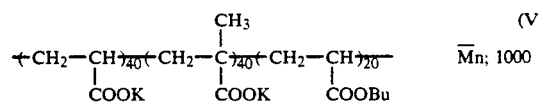 (V-22) $\overline{Mn};$ 1000

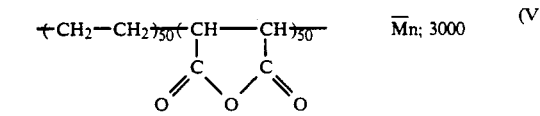 (V-23) $\overline{Mn};$ 3000

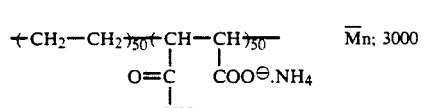 (V-24) $\overline{Mn};$ 3000

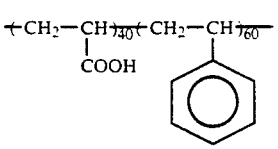 (V-25) $\overline{Mn};$ 2000

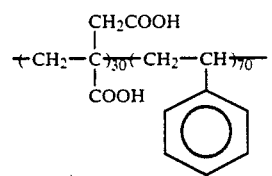 (V-26) $\overline{Mn};$ 4000

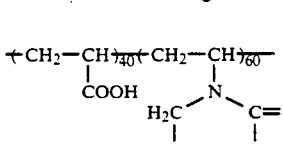 (V-27) $\overline{Mn};$ 5000

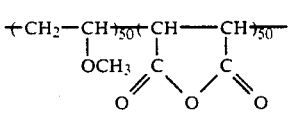 (V-28) $\overline{Mn};$ 2000

Content of the above compounds (1)–(5) is suitably about 0.1%—about 20% by weight and weight ratio is preferably about 1—about 100 times the weight of the organic compound used in combination.

(6) Hydroxyaryl fatty acid

This is preferably represented by the following formula:

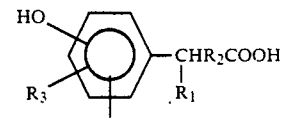

(wherein $R_1$ denotes a straight chain alkyl group of 1–19 carbon atoms or a hydrogen atom, $R_2$ denotes a straight chain alkylene group of 1–19 carbon atoms, sum of carbon numbers of $R_1$ and $R_2$ is 10–20 and $R_3$ and $R_4$ each denotes a hydrogen atom, a hydroxyl group, or an alkyl or alkoxy group of 1–9 carbon atoms).

As examples of the hydroxyaryl fatty acid represented by the above formula, mention may be made of hydroxyphenylmyristic acid, hydroxyphenylpalmitic acid, hydroxyphenylstearic acid, hydroxyphenyloleic acid, bis-hydroxyphenylstearic acid, hydroxyphenylbehenic acid, dihydroxyphenylpalmitic acid, trihydroxyphenylstearic acid, hydroxymethylphenylstearic acid, hydroxynonylphenylstearic acid and hydroxymethoxyphenylpalmitic acid.

Content of this hydroxyaryl fatty acid is suitably about 10-4%—about 5% by weight and weight ratio is about 1/100 - about 10 times the weight of the organic compound used in combination.

(7) Organic sulfide compound

Typical examples of the organic disulfide compound are as follows.

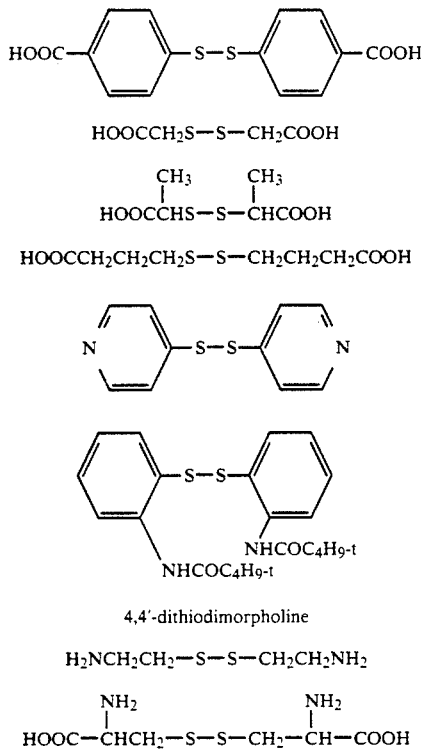

4,4'-dithiodimorpholine (VI-7)

$H_2NCH_2CH_2-S-S-CH_2CH_2NH_2$ (VI-8)

$$\underset{HOOC-CHCH_2-S-S-CH_2-CH-COOH}{\overset{NH_2 \qquad\qquad NH_2}{|\qquad\qquad\qquad |}}$$ (VI-9)

Content of the organic disulfide compound is suitably about 0.1%—about 20% by weight and weight ratio is about 1/10—about 10 times the weight of the organic compound used in combination.

The above compounds (1)-(7) may be used alone or in combination of two or more.

The processing composition containing the above-mentioned organic compound and the surfactant compound used in combination with the organic compound according to the present invention preferably has a pH range of from weakly acidic value to alkaline value and can contain optional inorganic or organic acid or alkali agent.

Furthermore, when an oxidizing agent is used in combination with the above organic compound and the surfactant compound in the processing composition of the present invention, further improvement of printing endurance can be attained and besides deterioration of storage stability of the organic compound can be prevented.

The oxidizing agents used in the present invention are mentioned in Japanese Patent Kokai No. 55-98753, namely, those as enumerated below.

(1) Secondary metal ions: These include metal ions other than primary metal ions, namely, those having minimum valence. Examples of these secondary metal ions are $Cu+^2$, $Au+^3$, $Tl+^3$, $Cr+^3$, $Cr+^6$, $Mn+^4$, $Mn+^7$, $Ce+^4$, $Rh+^3$, $Pb+^4$, $Pd+z$, $Pd+^4$, $Co+^3$, $Ir+^3$, $Fe+^3$, $Ni+^3$, $Sn+^4$, $V+^4$, $Bi+^3$, $Mo+^3$, $Mo+^5$, $Pt+^4$, $Ru+^4$, $Te+^4$, and $W+^4$ These metal ions may be used as water-soluble salts such as halogen salts, nitrates and sulfates In case of water-insoluble or slightly soluble compounds, there may be used water-miscible organic solvents, e.g., alcohols such as methanol, ethanol, and isopropanol., dimethylformamide, dioxane, and acetone. In some case, organic water-immiscible solvents may be used.

(2) Halogens: Chlorine, bromine, iodine.

(3) Halogenic acids: hypohalogenic acids such as potassium hypochlorite, sodium hypoiodite and sodium hypobromite, halogenic acids such as sodium chlorate, potassium iodate, and sodium bromate, perhalogenic acids such as orthoperiodic acid ($H5IO_6$) and sodium metaperiodate ($NaIO_4$), N-halocarboxylic acid amides such as N-bromoacetamide and N-bromosuccinamide, N-halosulfonamides such as N-chloro-p-toluenesulfonamide (chloramine-T) and N-chlorobenzenesulfonamide (chloramine-B) and hypohalogenic acid esters such as T-butyl hypochlorite. These may also be used as aqueous solutions or solutions in water-miscible organic solvents and, if necessary, in water-immiscible solvents.

(4) Quinones: p-benzoquinine

Especially preferred secondary metal ions are $Cu+^2$ (such as cupric chloride and copper sulfate), $Au+^3$ (such as chloroauric acid), $Tl+^3$ (such as thallic nitrate), $Cr+^6$ (potassium bichromate), $Mn+^7$ (such as potassium permanganate), $Fe+^3$, (such as ferric chloride, ferric sulfate and ferric salt of ethylenediaminetetraacetic acid), $Co+^3$ (cobalt (III) complex as mentioned in Japanese Patent Kokai No. $^{48-9729}$),$Pd+^2$ such as palladium chloride), and $Ni+^3$, $Ce+^4$, and $Ir+^3$.

The oxidizing agent may be contained in the same processing composition as that containing the organic compound or may be contained in another processing composition.

Content of the oxidizing agent in various processing compositions is practically from about 1% to saturation concentration thereof, preferably at least about 3%.

The present invention can be applied to lithographic printing plates as mentioned above which utilize silver images (including silver halide images) as ink receptive areas.

Silver halide emulsion may be provided on printing plate material per se or may be provided on separate negative sheet as silver source for printing plate material having image receiving layer.

Silver halide emulsion may be any of silver chloride, silver bromide, silver chlorobromide and these silver halides which further contain an iodide. Binder for the emulsion is preferably gelatin, but this gelatin may be partially or totally replaced with other colloid materials such as casein, albumin, polyvinyl alcohol, ester of polyvinyl alcohol-maleic anhydride, cellulose derivatives, acrylamide-vinylimidazole copolymer, etc. Normally, silver halide is used in an amount of $^{0.5-7}$ g/m² in terms of silver nitrate and binder is used in an amount of $^{0.5-10}$ g/m².

Silver halide emulsion can be prepared by processes known in photographic industries and processes for preparation of the emulsion especially used for printing plates are also disclosed in the known patent publications referred to before.

Lithographic printing plates to which the present invention is applied are generally made by imagewise exposure, then treating with alkaline developing solution, and then subjecting to treatments with plate making processing solutions and processing solutions for printing such as neutralizing solution, fixing solution, etch solution, desensitizing solution, and dampening solution. The developing solution may be any of usual photographic alkaline developing solution containing developing agent such as hydroquinone, developing solution for silver complex diffusion transfer process containing hypo, and activated high alkali developing solution.

Difference between oleophilicity of image area and hydrophilicity of non-image area is increased when the developing solutions used in the present invention contain organic compound containing mercapto group or thione group which improves ink receptivity of image area as described in Japanese Patent Kokai No. 51-486 or compound having heterocyclic group containing sulfur atom.

Compositions of processing solutions such as neutralizing, fixing, desensitizing, etching and dampening solutions used in the present invention are those known to one skilled in the art according to the object and kind of plates. It is preferred to modify the processing activity by adding thereto known substances such as the above mercapto organic compound, desensitization accelerator, buffer, preservative, storing agent and wetting agent. Examples of these substances are gum arabic, carboxymethylcellulose, sodium alginate, vinylpyrrolidone, vinylimidazole, methylvinyl ether-maleic anhydride copolymer, carboxymethyl starch, ammonium alginate, alginic acid oxidized cellulose, methylcellulose, sulfates (such as sodium sulfate and ammonium sulfate), sulfites (such as potassium sulfite and sodium sulfite), phosphoric acid, nitric acid, nitrous acid and tannic acid and salts thereof, polyol compounds containing at least 2 hydroxy groups (such as polyethylene glycol, propylene glycol, pentaerythritol, glycerol, diethylene glycol, and hexylene glycol), organic weak acids (such as citric acid, succinic acid, tartaric acid, adipic acid, ascorbic acid, and propionic acid), inorganic fine particles (such as colloidal silica and alumina), polyacrylic acid, ammonium bichromate, chrome alum, alginic acid and propylene glycol ester, aminopolycarboxylates (such as sodium ethylenediaminetetraacetate), and surfactants. These substances are used making and printing processing solutions which more completely satisfy the object of the present invention can be obtained.

Besides, the composition of the present invention may further contain water-miscible organic solvents such as methanol, dimethylformamide and dioxane and a slight amount of coloring agents such as phthalocyanine dyes, Malachite Green and ultramaline for discremenation of solution or considering appearance.

The following nonlimiting examples explain the present invention in more detail.

EXAMPLE 1

On one side of a subbed polyester film support was provided a matting layer containing silica particles of 5 P in average particle size. On the opposite side was provided an antihalation undercoat layer (adjusted to pH 4.0) containing carbon black in an amount to give a reflectance of 3% and 20% by weight, based on photographic gelatin, of silica powder of 7 Pm in average particle size. Onto the undercoat layer was then applied a high sensitivity silver chloride emulsion layer (adjusted to pH 4.0) containing 5% by weight, based on photographic gelatin, of silica powder of 7 $\mu$m in average particle size which was chemically sensitized and then spectrally sensitized to green sensitive region.

Amount of gelatin in the undercoat layer was 3.5 g/m$^2$, that of gelatin in the emulsion layer was 0.8 g/m$^2$ and that of silver halide in terms of silver nitrate was 1.0 g/m$^2$. These undercoat layer and the emulsion layer contained formalin as a hardener in an amount of 5.0 mg/g gelatin. After drying, the coated support was heated at 40° C. for 14 days and then on the emulsion layer was coated a nuclei coating composition used for plate No. 31 in Example 2 of Japanese Patent Kokai No. 54-103104 and dried to make a light-sensitive material for lithographic printing plate. The silver halide emulsion contained $4 \times 10^{-6}$ mol of rhodium chloride per 1 mol of silver halide, which had been added during physical ripening and had an average grain size of 0.40 micron.

The resulting light-sensitive material for lithographic printing plate was subjected to imagewise exposure by a process camera having reversal mechanism and to development with the following developing solution (used) at 30 C for 30 seconds and then treated with the following neutralizing solution.

| [Developing solution] | |
|---|---|
| Sodium hydroxide | 24 g |
| Potassium hydroxide | 8 g |
| Anhydrous sodium sulfite | 50 g |
| 3-Mercapto-4-acetamido-5-n-heptyl-1,2,4-triazole | 0.15 g |
| 2-Mercaptobenzoic acid | 0.1 g |
| 2-Methyl-2-amino-1-propanol | 30 g |
| Uracil | 0.2 g |
| Water to make up 1 liter. | |
| [Neutralizing solution] | |
| Ethylene glycol | 5 g |
| Colloidal silica (20% aqueous solution) | 1 g |
| Anhydrous sodium sulfite | 10 g |
| Sodium secondary phosphate | 35 g |
| Water to make up 1 liter. (adusted to pH 7.8) | |

The thus obtained printing plate was mounted on an offset printing machine and applied with the following etch solution all over the plate surface and printing was run using the following dampening solution.

| [Etch solution] | |
|---|---|
| Water | 600 ml |
| Isopropanol | 400 ml |
| Ethylene glycol | 50 g |
| [Dampening solution] (diluted to tenfold with water in actual use) | |
| Water | 800 ml |
| Succinic acid | 6 g |
| Sodium sulfate | 25 g |
| Ethylene glycol | 100 g |
| Colloidal silica (20% aqueous solution) | 28 g |

The printing machine used was A. B. Dick 350CD (trademark for offset printing machine manufacture by A. B. Dick Co.). Ink receptivity, degree of stain and printing endurance were determined by the following

(1) Ink receptivity

Simultaneously with contacting a roller applied with an ink with the plate surface, feeding of paper was started and the ink receptivity was evaluated in terms of the number of copies before satisfactory image density became possible to obtain.

(2) Evaluation of stain

Printing of 1,000 copies was carried out and degree of stain was evaluated in the following three grades.
○: No stain occurred.
Δ: Partial or light stain occurred.
x: Light stain occurred all over the surface.

(3) Printing endurance

Printing endurance was evaluated in terms of the number of copies delivered before disappearance of ink in silver image portions when printing of 1,000-50,000 copies was effected and expressed in the following 5 grades.
1: Less than 5,000 copies
2: Less than 10,000 copies
3: Less than 30,000 copies
4: Less than 50,000 copies
5: More than 50,000 copies Making of printing plates and printing and evaluation were carried out in the same manner as above except that after the treatment with the neutralizing solution and drying, the whole surface of plate was treated with the oleophilizing solution as shown in the following tables. Furthermore, these oleophilizing solutions were left to stand for 2 weeks at 50° C. and then these were applied in the same manner as above and evaluation was conducted in the same manner as above.

|  | I | II | III | IV |
|---|---|---|---|---|
| $Na_3PO_4 \cdot 12H_2O$ | 15 | 15 | 15 | 15 |
| Compound I-18 | 5 | 5 | 5 | 5 |
| Surfactant A | — | 20 | — | — |
| Surfactant B | — | — | 20 | — |
| Surfactant C | — | — | — | 20 |
| Water to make up 1 l | | | | |

Surfactants:
A: Sodium β-naphthalenesulfonate formalin condensate (RABELIN FA-N manufactured by Dai-ichi Kogyo Seiyaku Co., Ltd.)
B: Sodium di-2-ethylhexylsulfosuccinate (PELEX TO-P manufactured by Kao Soap Co., Ltd.)
C: Polyoxyethylenenonylphenyl ether (NP-10 manufactured by Nikko Chemicals Co., Ltd.)

The results are shown in Table 1. Results on the oleophilizing solutions after lapse of time are shown in lower column therein.

TABLE 1

| Oleophilizing solutions | Ink receptivity | Stain | Printing endurance |
|---|---|---|---|
| No | 30 | ○ | 1 |
| I | 15 | ○ | 3 |
|  | 30 | ○ | 1 |
| II | 15 | ○ | 3 |
|  | 20 | ○ | 3 |
| III | 15 | ○ | 3 |
|  | 30 | ○ | 1 |
| IV | 15 | ○ | 3 |
|  | 30 | ○ | 1 |

It can be seen that in the comparative oleophilizing solutions I, III and IV, oleophilizing ability of mercapto compound I-18 was deteriorated with lapse of time.

EXAMPLE 2

Example 1 was repeated except that the solutions shown in the following Table 2 were used. The results only on printing endurance are shown in Table

TABLE 2

|  | a | b | c | d | e | f | g | h | i | j |
|---|---|---|---|---|---|---|---|---|---|---|
| Water | | | | | 600 ml | | | | | |
| Isopropanol | | | | | 400 ml | | | | | |
| Ethylene glycol | | | | | 50 ml | | | | | |
| Compound I-6 | 10 | 10 | | | | | | | | |
| Compound I-12 | | | 10 | 10 | | | | | | |
| Compound I-18 | | | | | 5 | 5 | | | 5 | 5 |
| Compound I-4 | | | | | | | 5 | 5 | 5 | 5 |
| Comparative compound S | | | | | | | 10 | 10 | | |
| EDTA ferric salt | | | | | | | 50 | 50 | 50 | 50 |
| Surfactant A | | 50 | | 50 | | 50 | | 50 | | 50 |
| Printing endurance (just after preparation) | 3 | 3 | 3 | 3 | 4 | 4 | 2 | 2 | 5 | 5 |
| Printing endurance (after lapse of time) | 1 | 3 | 1 | 3 | 1 | 4 | 2 | 2 | 1 | 4 |

Comparative compound S: 3-Mercapto-4-acetamido-5-n-butyl-1,2,4-triazole

EXAMPLE 3

Example 1 was repeated except that the following oleophilizing solution II was used.

|  | I | II | III | IV |
|---|---|---|---|---|
| $Na_3PO_4 \cdot 12H_2O$ | 15 | 15 | 15 | 15 |
| Compound I-18 | 5 | 5 | 5 | 5 |
| Surfactant A | — | 20 | — | — |
| Surfactant B | — | — | 20 | — |
| Surfactant C | — | — | — | 20 |
| Water to make up 1 l | | | | |

Surfactants:
A: Compound (II-6) exemplified hereinbefore.
B: Sodium di-2-ethylhexylsulfosuccinate (PELEX TO-P manufactured by Kao Soap Co., Ltd.)
C: Polyoxyethylenenonylphenyl ether (NP-10 manufactured by Nikko Chemical$ Co., Ltd.)

The results are shown in Table 3. Results on the oleophilizing solutions after lapse of time are shown in lower column.

TABLE 3

| Oleophilizing solutions | Ink receptivity | Stain | Printing endurance |
|---|---|---|---|
| No | 30 | ○ | 1 |
| I | 15 | ○ | 3 |
|  | 30 | ○ | 1 |
| II | 15 | ○ | 3 |
|  | 20 | ○ | 3 |
| III | 15 | ○ | 3 |
|  | 30 | ○ | 1 |
| IV | 15 | ○ | 3 |
|  | 30 | ○ | 1 |

It can be seen that in the comparative oleophilizing solutions I, III and IV, oleophilizing ability of mercapto compound I-18 was deteriorated with lapse of time.

EXAMPLE 4

Example 3 was repeated except that the solutions shown in the following Table 4 were used as etch solution. The results only on printing endurance are shown in Table 4.

TABLE 4

|  | a | b | c | d | e | f | g | h | i | j |
|---|---|---|---|---|---|---|---|---|---|---|
| Water | | | | | 600 ml | | | | | |
| Isopropanol | | | | | 400 ml | | | | | |
| Ethylene glycol | | | | | 50 ml | | | | | |
| Compound I-6 | 10 | 10 | | | | | | | | |
| Compound I-12 | | | 10 | 10 | | | | | | |
| Compound I-18 | | | | | 5 | 5 | | | 5 | 5 |

TABLE 4-continued

|  | a | b | c | d | e | f | g | h | i | j |
|---|---|---|---|---|---|---|---|---|---|---|
| Compound I-4 |  |  |  |  | 5 | 5 |  |  | 5 | 5 |
| Comparative compound S |  |  |  |  |  |  | 10 | 10 |  |  |
| EDTA ferric salt |  |  |  |  |  |  | 50 | 50 | 50 | 50 |
| Surfactant A |  | 50 |  | 50 |  | 50 |  | 50 |  | 50 |
| Printing endurance (just after preparation) | 3 | 3 | 3 | 3 | 4 | 4 | 2 | 2 | 5 | 5 |
| Printing endurance (after lapse of time) | 1 | 3 | 1 | 3 | 1 | 4 | 2 | 2 | 1 | 4 |

Comparative compound S: 3-Mercapto-4-acetamido-5-n-butyl-1,2,4-triazole

EXAMPLE 5

Example 3 was repeated except that compounds (II-2), (II-10), (II-11) and (II-15) were used as the surfactant in the oleophilizing solution. The effects of the present invention were recognized as in Example 3.

EXAMPLE 6

Example 1 was repeated except that the following oleophilizing solutions were used.

|  | I | II | III | IV |
|---|---|---|---|---|
| $Na_3PO_4 \cdot 12H_2O$ | 15 | 15 | 15 | 15 |
| Compound I-18 | 5 | 5 | 5 | 5 |
| Surfactant (III-1) | — | 20 | — | — |
| Surfactant (III-8) | — | — | 20 | — |
| Surfactant (III-20) | — | — | — | 20 |
| Water to make up 1 l |  |  |  |  |

The results are shown in Table 5. Results on the oleophilizing solutions after lapse of time are shown in lower column.

TABLE 5

| Oleophilizing solutions | Ink receptivity | Stain | Printing endurance |
|---|---|---|---|
| No | 30 | ○ | 1 |
| I | 15 | ○ | 3 |
|  | 30 | ○ | 1 |
| II | 15 | ○ | 3 |
|  | 20 | ○ | 3 |
| III | 15 | ○ | 3 |
|  | 20 | ○ | 3 |
| IV | 15 | ○ | 3 |
|  | 20 | ○ | 3 |

It can be seen that in the blank solution I, oleophilizing ability of mercapto compound I-18 was deteriorated with lapse of time while the oleophilizing solutions II-IV of the present invention showed substantially no deterioration in printing characteristics after lapse of time.

EXAMPLE 7

Example 6 was repeated except that the solutions shown in the following Table 6 were used as etch solution. The results only on printing endurance are shown in Table 6.

TABLE 6

|  | a | b | c | d | e | f | g | h | i | j |
|---|---|---|---|---|---|---|---|---|---|---|
| Water | 600 ml |  |  |  |  |  |  |  |  |  |
| Isopropanol | 400 ml |  |  |  |  |  |  |  |  |  |
| Ethylene glycol | 50 ml |  |  |  |  |  |  |  |  |  |
| Compound I-6 | 10 | 10 |  |  |  |  |  |  |  |  |
| Compound I-12 |  |  | 10 | 10 |  |  |  |  |  |  |
| Compound I-18 |  |  |  |  | 5 | 5 |  |  | 5 | 5 |

TABLE 6-continued

|  | a | b | c | d | e | f | g | h | i | j |
|---|---|---|---|---|---|---|---|---|---|---|
| Compound I-4 |  |  |  |  | 5 | 5 |  |  | 5 | 5 |
| Comparative compound S |  |  |  |  |  |  | 10 | 10 |  |  |
| EDTA ferric salt |  |  |  |  |  |  | 50 | 50 | 50 | 50 |
| Compound (III-8) |  | 40 |  | 40 |  | 40 |  | 40 |  | 40 |
| Printing endurance (just after preparation) | 3 | 3 | 3 | 3 | 4 | 4 | 2 | 2 | 5 | 5 |
| Printing endurance (after lapse of time) | 1 | 3 | 1 | 3 | 0 | 4 | 2 | 2 | 1 | 5 |

Comparative compound S: 3-Mercapto-4-acetamido-5-n-butyl-1,2,4-triazole

EXAMPLE 8

Example 1 was repeated except that the following oleophilizing solutions were used.

|  | I | II | III | IV |
|---|---|---|---|---|
| $Na_3PO_4 \cdot 12H_2O$ | 15 | 15 | 15 | 15 |
| Compound I-18 | 5 | 5 | 5 | 5 |
| Surfactant (IV-1) | — | 20 | — | — |
| Surfactant (IV-12) | — | — | 20 | — |
| Surfactant (IV-15) | — | — | — | 20 |
| Water to make up 1 l |  |  |  |  |

The results are shown in Table 7. Results on the oleophilizing solutions after lapse of time are shown in lower column therein.

TABLE 7

| Oleophilizing solutions | Ink receptivity | Stain | Printing endurance |
|---|---|---|---|
| No | 30 | ○ | 1 |
| I | 15 | ○ | 3 |
| (blank) | 30 | ○ | 1 |
| II | 15 | ○ | 3 |
|  | 20 | ○ | 3 |
| III | 15 | ○ | 3 |
|  | 20 | ○ | 3 |
| IV | 15 | ○ | 3 |
|  | 20 | ○ | 3 |

It can be seen that in the blank solution I, oleophilizing ability of mercapto compound I-18 was deteriorated with lapse of time while the oleophilizing solutions II-IV of the present invention showed substantially no deterioration in printing characteristics after lapse of time.

EXAMPLE 9

Example 8 was repeated except that the solutions shown in the following Table 8 were used as etch solution. The results only on printing endurance are shown in Table 8.

TABLE 8

|  | a | b' | c | d | e | f | g | h | i | j |
|---|---|---|---|---|---|---|---|---|---|---|
| Water | 600 ml |  |  |  |  |  |  |  |  |  |
| Isopropanol | 400 ml |  |  |  |  |  |  |  |  |  |
| Ethylene glycol | 50 ml |  |  |  |  |  |  |  |  |  |
| Compound I-6 | 10 | 10 |  |  |  |  |  |  |  |  |
| Compound I-12 |  |  | 10 | 10 |  |  |  |  |  |  |
| Compound I-18 |  |  |  |  | 5 | 5 |  |  | 5 | 5 |
| Compound I-4 |  |  |  |  | 5 | 5 |  |  | 5 | 5 |
| Comparative compound S |  |  |  |  |  |  | 10 | 10 |  |  |
| EDTA ferric salt |  |  |  |  |  |  | 50 | 50 | 50 | 50 |
| Compound (IV-1) |  | 40 |  | 40 |  | 40 |  | 40 |  | 40 |
| Printing endurance (just after preparation) | 3 | 3 | 3 | 3 | 4 | 4 | 2 | 2 | 5 | 5 |

TABLE 8-continued

| | a | b | c | d | e | f | g | h | i | j |
|---|---|---|---|---|---|---|---|---|---|---|
| Printing endurance (after lapse of time) | 1 | 3 | 1 | 3 | 1 | 4 | 2 | 2 | 1 | 5 |

Comparative compound S: 3-Mercapto-4-acetamido-5-n-butyl-1,2,4-triazole

EXAMPLE 10

Example 1 was repeated except the following oleophilizing solutions were used.

| | I | II | III | IV | V | VI |
|---|---|---|---|---|---|---|
| Na$_3$PO$_4$.12H$_2$O | 15 | 15 | 15 | 15 | 15 | 15 |
| Compound I-18 | 5 | 5 | 5 | 5 | 5 | 5 |
| A | — | 20 | — | — | — | — |
| B | — | — | 20 | — | — | — |
| C | — | — | — | 20 | — | — |
| D | — | — | — | — | 20 | — |
| E | — | — | — | — | — | 20 |
| Water to make up 1 l | | | | | | |

A: Sodium di-2-ethylhexylsulfosuccinate (PELEX TO-P manufactured by Kao Soap Co., Ltd.)
B: Polyoxyethylenenonylphenyl ether (NP-10 manufactured by Nikko Chemicals Co., Ltd.)
C: Water-soluble polymer (V-2) exemplified hereabove.
D: Water-soluble polymer (V-11) exemplified hereabove.
E: Water-soluble polymer (V-25) exemplified hereabove.

The results are shown in Table 9. Results on the oleophilizing solutions after lapse of time are shown in lower column the rein.

TABLE 9

| Oleophilizing solutions | Ink receptivity | Stain | Printing endurance |
|---|---|---|---|
| No | 30 | ○ | 1 |
| I | 15 | ○ | 3 |
| | 30 | ○ | 1 |
| II | 15 | ○ | 3 |
| | 30 | ○ | 1 |
| III | 15 | ○ | 3 |
| | 20 | ○ | 1 |
| IV | 15 | ○ | 3 |
| | 20 | ○ | 3 |
| V | 15 | ○ | 3 |
| | 20 | ○ | 3 |
| VI | 15 | ○ | 3 |
| | 20 | ○ | 3 |

It can be seen that in the comparative oleophilizing solutions I, II, and III, oleophilizing ability of mercapto compound I-18 was deteriorated with lapse of time.

EXAMPLE 11

Example 10 was repeated except that the solutions as shown in the following Table 10 were used. The results only on printing endurance are shown in Table 10.

TABLE 10

| | a | b | c | d | e | f | g | h | i | j |
|---|---|---|---|---|---|---|---|---|---|---|
| Water | | | | | 600 ml | | | | | |
| Isopropanol | | | | | 400 ml | | | | | |
| Ethylene glycol | | | | | 50 ml | | | | | |
| Compound I-23 | 10 | 10 | | | | | | | | |
| Compound I-25 | | | 10 | 10 | | | | | | |
| Compound I-18 | | | | | 5 | 5 | | | 5 | 5 |
| Compound I-4 | | | | | 5 | 5 | | | 5 | 5 |
| Comparative | | | | | | | 10 | 10 | | |

TABLE 10-continued

| | a | b | c | d | e | f | g | h | i | j |
|---|---|---|---|---|---|---|---|---|---|---|
| compound S | | | | | | | | | | |
| EDTA ferric salt | | | | | | | 50 | 50 | 50 | 50 |
| Water soluble polymer (V-11) | 50 | | 50 | | 50 | | 50 | | 50 | |
| Printing endurance (just after preparation) | 3 | 3 | 3 | 3 | 4 | 4 | 2 | 2 | 5 | 5 |
| Printing endurance (after lapse of time) | 1 | 3 | 1 | 3 | 1 | 4 | 2 | 2 | 1 | 4 |

Comparative compound S: 3-Mercapto-4-acetamido-5-n-butyl-1,2,4-triazole

EXAMPLE 12

Example 1 was repeated except the following oleophilizing solutions were used.

| | I | II | III | IV |
|---|---|---|---|---|
| Na$_3$PO$_4$12H$_2$O | 15 | 15 | 15 | 15 |
| Compound I-18 | 5 | 5 | 5 | 5 |
| Stabilizing agent | 20 | 20 | 20 | 20 |
| A | — | 2.0 | — | — |
| B | — | — | 2.0 | — |
| C | — | — | — | 2.0 |
| Water to make up 1 l | | | | |

Stabilizing agent: Naphthalenesulfonic acid formalin condensate (RABELIN FA-N manufactured by DAiichi Kogyo Seiyaku Co., Ltd.)
A: Hydroxyphenylstearic acid (NOVAACID P manufactured by Nippon Oil & Fats Co., Ltd.)
B: Di-n-butyl phthalate
C: Polyoxyethylenenonylphenyl ether (BNP-10 manufactured by Nikko Chemicals Co., Ltd.) on the oleophilizing solutions after lapse of time are shown in lower column therein.

TABLE 11

| Oleophilizing solutions | Ink receptivity | Stain | Printing endurance |
|---|---|---|---|
| No | 30 | ○ | 1 |
| I | 15 | ○ | 3 |
| | 25 | ○ | 3 |
| II | 10 | ○ | 3 |
| | 10 | ○ | 3 |
| III | 10 | ○ | 3 |
| | 25 | ○ | 3 |
| IV | 15 | ○ | 3 |
| | 30 | ○ | 3 |

EXAMPLE 13

Example 12 was repeated except that triethanolamine salt of hydroxyphenylstearic acid, hydroxymethylphenylstearic acid, dihydroxyphenylstearic acid, hydroxyphenylbehenic acid and dihydroxyphenylbehenic acid were used in place of A and similar results to those of Example 12 were obtained.

EXAMPLE 14

Example 1 was repeated except that the following oleophilizing solutions were used.

| | I | II | III |
|---|---|---|---|
| Na$_3$PO$_4$.12H$_2$O | 15 | 15 | 15 |
| Compound I-18 | 5 | 5 | 5 |
| Disulfide compund (VI-3) | — | 10 | — |
| Disulfide compund (VI-6) | — | — | 10 |

-continued

| | I | II | III |
|---|---|---|---|
| Water to make up 1 l | | | |

The results are shown in Table 12. Results on the oleophilizing solutions after lapse of time are shown in lower column therein.

TABLE 12

| Oleophilizing solutions | Ink receptivity | Stain | Printing endurance |
|---|---|---|---|
| No | 30 | ○ | 1 |
| I (blank) | 15 | ○ | 3 |
| | 30 | ○ | 1 |
| II | 15 | ○ | 3 |
| | 20 | ○ | 3 |
| III | 15 | ○ | 3 |
| | 20 | ○ | 3 |

It can be seen that in the blank solution I, oleophilizing ability of mercapto compound I-18 was deteriorated with lapse of time while the oleophilizing solutions II-III of the present invention showed substantially no deterioration in the excellent printing characteristics after lapse of time.

EXAMPLE 15

Example 14 was repeated except that 50 g/l of EDTA Fe NH₄ salt was added to the solutions and as a result there were obtained the results similar to those of Example 14.

EXAMPLE 16

Example 14 was repeated except that compound (I-25) or mixture of compounds (I-18) and (I-4) (1:1 in weight ratio) was used in place of compound (I-18) to obtain similar results to those of Example 14.

What is claimed is:

1. A processing composition which is used for lithographic printing plate where silver image is used as ink receptive area and which contains an organic compound having two or more mercapto groups or thione groups wherein said composition additionally contains an aromatic sulfonic acid formalin condensate which is represented by the following formula,

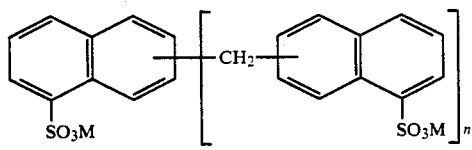

wherein n is an integer or 1 or more and M represents an alkali metal atom, an anionic surfactant having a polyoxyethylene group, which is represented by the following formula:

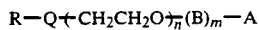

wherein R represents a substituted or unsubstituted alkyl, alkenyl or aryl group of 1-30 carbon atoms, O represents

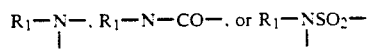

wherein R1 represents a hydrogen atom or a substituted or unsubstituted alkyl group; B represents a divalent group; m is O or an integer of 1 or more; A represents $-SO_3M$, $-COOM$, $-O-SO_3M$,

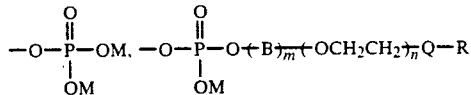

wherein M represents a cation, and B, Q and R ar as defined above; and n which is an average polymerization degree of ethylene oxide is 1-50, an aromatic carboxylic acid, which is represented by the following formula:

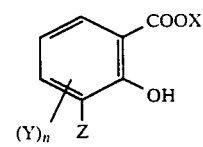

wherein X represents a hydrogen atom, an alkali metal atom, an ammonium ion, an alkyl group or an aryl group, Y represents a halogen atom, an alkyl group, an alkoxy group, an amino group, a hydroxy group, a nitro group, a sulfonic acid group, or a carboxylic acid group, Z represents a hydrogen atom, a halogen atom, an alkyl group, an alkoxy group, amino group, a nitro group, a sulfonic acid group, or a carboxylic acid group and n is 0, 1, 2, or 3 and when n is 2 or 3, Y may be identical or different, a hydrosulfite compound, which is represented by the following formula:

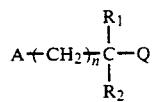

wherein A represents a hydroxyl group, an amino group or

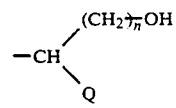

with the carbon atom to which they bond or one of R1 and R2 represents a hydrogen atom and the other represents a hydrogen atom, an alkyl group, an aryl group or a hydroxyl group, n is 0 or an integer of 1-8, O represents $-SO_3M$ or $-SO_3M$ and M represents a cation, a hydroxyaryl fatty acid, which is represented by the following formula:

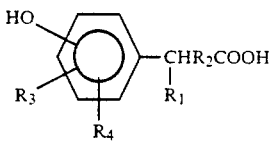

wherein R represents a straight chain alkyl group of 1-19 carbon atoms or a hydrogen atom, $R_2$ represents a straight chain alkylene group of 1-19 carbon atoms, sum of carbon numbers of $R_1$ and $R_2$ is 10-20, and $R_3$ and $R_4$ each represents a hydrogen atom, a hydroxyl group, or an alkyl or alkoxy group of 1-9 carbon atoms, or an organic disulfide compound.

2. A processing composition according to claim 1, wherein the organic disulfide compound is selected from the following group:

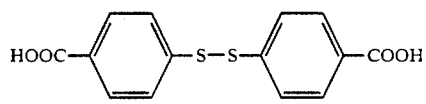 (VI-1)

HOOCCH₂S—S—CH₂COOH (VI-2)

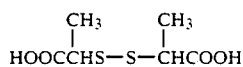 (VI-3)

HOOCCH₂CH₂CH₂S—S—CH₂CH₂CH₂COOH (VI-4)

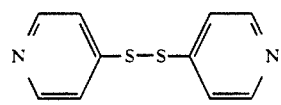 (VI-5)

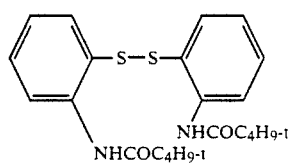 (VI-6)

4,4'-dithiodimorpholine (VI-7)

H₂NCH₂CH₂—S—S—CH₂CH₂NH₂ (VI-8)

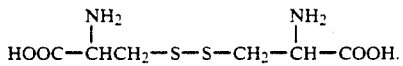

3. A processing composition according to claim 1, wherein content of the organic compound having two or more mercapto or thione groups is about 0.01—about 5% by weight.

4. A processing composition according to claim 1 which is a processing composition used for plate making or for printing.

5. A method for plate making which includes a step of treating a lithographic printing plate with the processing composition of claim 1.

6. A method of printing which includes a step of treating a lithographic printing plate with the processing composition of claim 1.

7. A processing composition which is used for lithographic printing plate where silver image is used as ink receptive area and which contains an organic compound having two or more mercapto groups or thione groups wherein said composition additionally contains an aromatic sulfonic acid formalin condensate which is represented by the following formula.

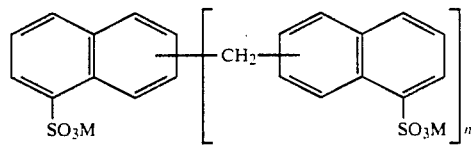

wherein n is an integer or 1 ore more and M represents an alkali metal atom, an anionic surfactant having a polyoxyethylene group, which is represented by the following formula:

R—Q—(CH₂CH₂O)ₙ(B)ₘ—A wherein R represents a substituted or unsubstituted alkyl, alkenyl or aryl group of 1-30 carbon atoms, Q represents

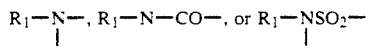

wherein R1 represents a hydrogen atom or a substituted or unsubstituted alkyl group; B represents a divalent group; m is 0 or an integer of 1 ore more; A represents —SO₃M, —COOM, —O—SO₃M,

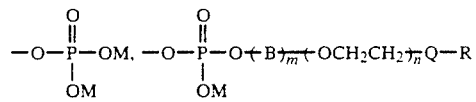

wherein M represents a cation, and B, Q and R are as defined above; and n which is an average polymerization degree of methylene oxide is 1-50, an aromatic carboxylic acid, which is represented by the following formula:

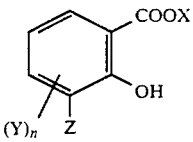

wherein X represents a hydrogen atom, an alkali metal atom, an ammonium ion, an alkyl group or an aryl group, Y represents a halogen atom, an alkyl group, an alkoxy group, an amino group, a hydroxy group, a nitro group, a sulfonic acid group, or a carboxylic acid group, Z represents a hydrogen atom, a halogen atom, an alkyl group, an alkoxy group, amino group, a nitro group, a sulfonic acid group, or a carboxylic acid group and n is 0, 1, 2, or 3 and when n is 2 or 3, Y may be identical or different, a hydrosulfite compound, which is represented by the following formula:

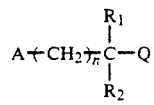

wherein A represents a hydroxyl group, an amino group or

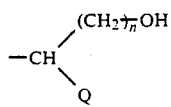

with the carbon atom to which they bond or one of R1 and R2 represents a hydrogen atom and the other represents a hydrogen atom, an alkyl group, an aryl group or a hydroxyl group, n is 0 or an integer of 1-8, Q represents —$SO_3M$ or —$SO_2M$ and M represents a cation, a hydroxyaryl fatty acid, which is represented by the following formula:

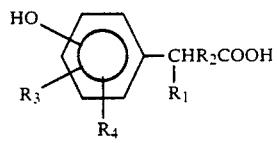

wherein $R_1$ represents a straight chain alkyl group of 1-19 carbon atoms or a hydrogen atom, $R_2$ represents a straight chain alkylene group of 1-19 carbon atoms, sum of carbon numbers of $R_1$ and $R_2$ is 10-20, and $R_3$ and $R_4$ each represents a hydrogen atom, a hydroxyl group, or an alkyl or alkoxy group or 1-9 carbon atoms, or an organic disulfide compound, and wherein said composition additionally contains an oxidizing agent.

* * * * *